(12) United States Patent
Jan

(10) Patent No.: US 6,861,758 B2
(45) Date of Patent: Mar. 1, 2005

(54) STRUCTURE AND MANUFACTURING PROCESS OF LOCALIZED SHUNT TO REDUCE ELECTROMIGRATION FAILURE OF COPPER DUAL DAMASCENE PROCESS

(75) Inventor: Chia-Hong Jan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/231,321

(22) Filed: Aug. 30, 2002

(65) Prior Publication Data

US 2004/0041273 A1 Mar. 4, 2004

(51) Int. Cl.⁷ .......................... H01L 23/48; H01L 23/52; H01L 29/40
(52) U.S. Cl. ................... 257/774; 257/734; 257/750; 257/758; 257/762; 257/770; 257/776; 438/618; 438/694; 438/687; 438/689
(58) Field of Search ................... 257/734, 750, 257/758, 762, 774–776; 438/618, 694, 687, 689

(56) References Cited

U.S. PATENT DOCUMENTS

| | | | | |
|---|---|---|---|---|
| 3,863,334 A | * | 2/1975 | Coleman | 438/558 |
| 4,223,336 A | * | 9/1980 | Thompson | 257/609 |
| 4,837,176 A | * | 6/1989 | Zdebel et al. | 438/552 |
| 5,028,557 A | * | 7/1991 | Tsai et al. | 438/202 |
| 5,213,989 A | * | 5/1993 | Fitch et al. | 438/365 |
| 5,358,901 A | * | 10/1994 | Fiordalice et al. | 438/648 |
| 5,360,995 A | * | 11/1994 | Graas | 257/751 |
| 5,382,540 A | * | 1/1995 | Sharma et al. | 438/259 |
| 5,633,199 A | * | 5/1997 | Fiordalice et al. | 438/642 |
| 5,674,787 A | * | 10/1997 | Zhao et al. | 438/627 |
| 5,879,630 A | * | 3/1999 | Lescouzeres et al. | 422/82.02 |
| 5,939,788 A | * | 8/1999 | McTeer | 257/751 |
| 6,150,214 A | * | 11/2000 | Kaeriyama | 438/253 |
| 6,228,759 B1 | * | 5/2001 | Wang et al. | 438/625 |
| 6,500,749 B1 | * | 12/2002 | Liu et al. | 438/618 |
| 6,541,695 B1 | * | 4/2003 | Mowles | 136/252 |
| 6,633,085 B1 | * | 10/2003 | Besser et al. | 257/774 |
| 6,642,623 B2 | * | 11/2003 | McTeer | 257/762 |
| 6,703,307 B2 | * | 3/2004 | Lopatin et al. | 438/653 |
| 6,706,629 B1 | * | 3/2004 | Lin et al. | 438/687 |
| 6,713,875 B2 | * | 3/2004 | Farrar | 257/767 |
| 6,731,006 B1 | * | 5/2004 | Halliyal et al. | 257/758 |

FOREIGN PATENT DOCUMENTS

JP      11251436 A   *  9/1999

* cited by examiner

Primary Examiner—George Eckert
Assistant Examiner—Chris Chu
(74) Attorney, Agent, or Firm—Blakely, Sokoloff, Taylor & Zafman LLP

(57) ABSTRACT

A method and structure to reduce electromigration failure of semiconductor interconnects. In various embodiments, the area around a via is selectively doped with metallic dopants. The method and resulting structure reduce electromigration failure without adding unnecessary, performance-degrading resistance.

8 Claims, 3 Drawing Sheets

STRUCTURE AND MANUFACTURING PROCESS OF LOCALIZED SHUNT TO REDUCE ELECTROMIGRATION FAILURE OF COPPER DUAL DAMASCENE PROCESS

FIELD

The embodiments disclosed herein relate generally to semiconductor processing, and more particularly to fabrication of electrically conductive interconnects.

BACKGROUND

As the size of semiconductor devices continues to decrease, the stresses which such devices experience increases. For example, the electric current densities experienced by semiconductor devices can be great, particularly in areas in which current flows from one metal interconnect layer to another metal interconnect layer by a small connection referred to as a via.

This increased current density in a localized area such as a via can result in a phenomenon known as electromigration. Electromigration is generally the movement of atoms of a metal interconnect in the direction of current flow. This phenomenon is pronounced in areas with high current density (e.g., such as a via between interconnects).

Thus, in some respects the via acts as a bottleneck for current flow in the semiconductor device. Over time, the atoms which move away from the via due to electromigration will reduce the path through which current can flow near the via, and eventually, enough atoms will move away from the via to cause an open circuit, in which no current will flow from one metal interconnect layer to the next. Thus, electromigration is a serious problem which must be considered when reducing the size of semiconductor devices.

In order to address the problem of electromigration, one method used to construct semiconductor devices includes doping the entire metal interconnect layer with metallic dopants in order to prevent movement of the atoms of the metal interconnect layer in the direction of current flow. However, blanket doping of the metal interconnect layer results in an increased resistivity of the interconnect layer, which degrades performance of the semiconductor device. In some cases, blanket doping can increase the resistance of the device up to 20%, which is unacceptable. Thus, other ways to address electromigration are desired.

DESCRIPTION OF THE DRAWINGS

Various embodiments are illustrated by way of example and not by way of limitation in the figures of the accompanying drawings in which like references indicate similar elements. It should be noted that references to "an," "one," or "various" embodiments in this disclosure are not necessarily to the same embodiment, and such references mean at least one.

DETAILED DESCRIPTION

Various embodiments disclosed herein have selectively doped regions in the metal interconnect layer around the via in order to prevent electromigration while avoiding the increased resistivity caused by blanket doping the entire metal interconnect layer. In the following description, for the purposes of explanation, numerous specific details are set forth in order to provide a thorough understanding of the various embodiments. In other instances, well known structures and devices are omitted or simplified in order to avoid obscuring the details of the various embodiments.

The following description and the accompanying drawings provide examples for the purposes of illustration. However, these examples should not be construed in a limiting sense as they are not intended to provide an exhaustive list of all possible implementations.

Figure 1:
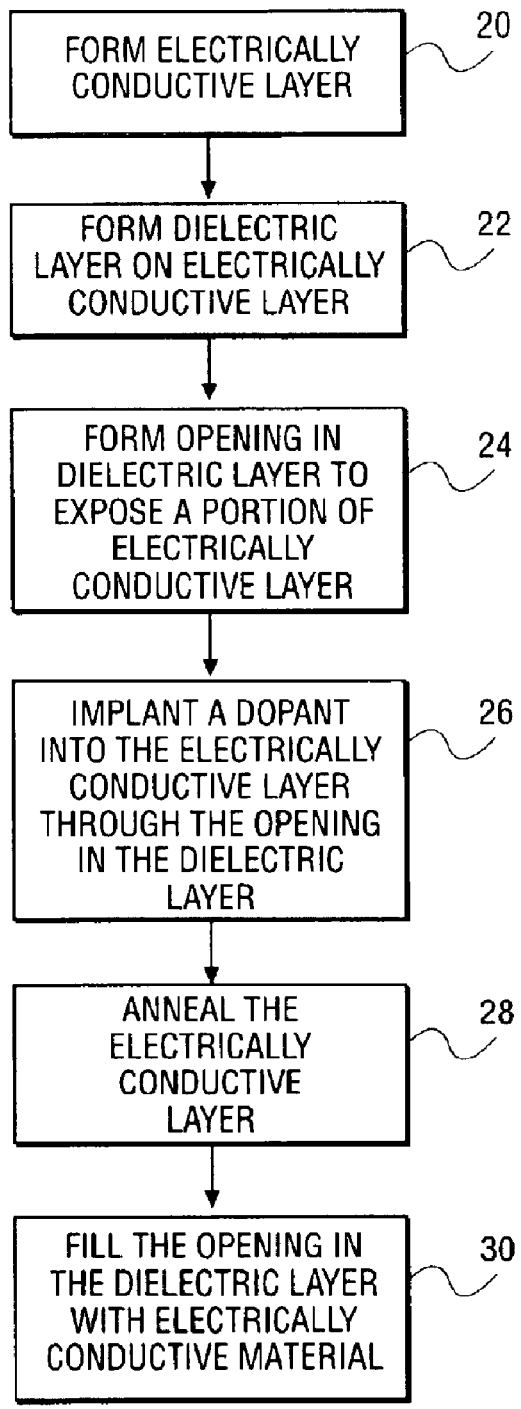
FIG. 1 is a flow chart of one method according to an embodiment.

Referring now to FIG. 1, a flow chart is shown which describes a method of selectively doping a portion of a metal interconnect layer according to one embodiment of forming a circuit structure. First, an electrically conductive layer is formed at block 20. At block 22, a dielectric layer is formed on the electrically conductive layer formed in block 20.

Next, an opening is formed in the dielectric layer to expose a portion of the electrically conductive layer at block 24. The exposed portion of the electrically conductive layer is the area to be selectively doped. At block 26, the dopant is implanted into the electrically conductive layer through the opening in the dielectric layer.

In various embodiments, the dopant used can be at least one of tin, aluminum, silicon, and magnesium. These, and other dopants, are known to prevent electromigration of the atoms that make up the metal interconnect layer. For example, the interconnect layers can be comprised of aluminum, copper or some combination thereof including, but not limited to, alloys of aluminum or copper.

When implanting either aluminum or magnesium as a dopant, one can use, for example, an implantation energy of approximately 50–200 KeV (with a target of 100 KeV) and a dose of approximately $5 \times 10^{14}$–$1 \times 10^{16}$ per square centimeter. When implanting tin as a dopant, one can use, for example, an implantation energy of approximately 200–400 KeV (with a target of 300 KeV) and a dose of approximately $5 \times 10^{14}$–$1 \times 10^{16}$ per square centimeter.

Although the dopant implantation characteristics may vary, various embodiments have the following implantation characteristics. Aluminum and/or magnesium can be used as the dopant with an ion implantation energy of 50–200 keV (100 keV preferred) with a dose of $5 \times 10^{14}$–$1 \times 10^{16}$ per square centimeter. Tin can be used as the dopant with an ion implantation energy of 200–400 keV (300 keV preferred) with a dose of $5 \times 10^{14}$–$1 \times 10^{16}$ per square centimeter.

Although the active mechanism for each dopant varies, the end result is that the dopants inhibit electromigration. For example, some dopants may act to inhibit electromigration of copper interconnect atoms by coarsing. Coarsing refers to the dopant enlarging the copper grain, which is generally small in an undoped state. This enlargement of the copper grain boundary eliminates the diffusion path for copper atoms when experiencing high current densities. Other dopants, such as tin, inhibit electomigration by blocking, which refers to the dopants depositing in the grain boundaries of the copper and blocking the diffusion path to inhibit electromigration.

After doping the electrically conductive layer at block 26, the electrically conductive layer is annealed at block 28. It is worth noting that the annealing process is not necessary but can be used to cause migration of the dopant through a portion of the electrically conductive layer. If included, the annealing process comprises heating the electrically conductive layer to a temperature between 100° Celsius and 400° Celsius for a period sufficient to cause the migration (e.g., diffusion) of the dopant. In various embodiments, the period sufficient to cause migration of the dopant is between 1 minute and 15 minutes.

The opening in the dielectric layer is filled with an electrically conductive material at block 30 in order to form a via or other conductive element. Although the method disclosed in FIG. 1 describes that the opening in the dielectric is filled after the annealing process, the opening can be filled prior to annealing in an alternative embodiment shown in FIGS. 6–9.

Figure 2:
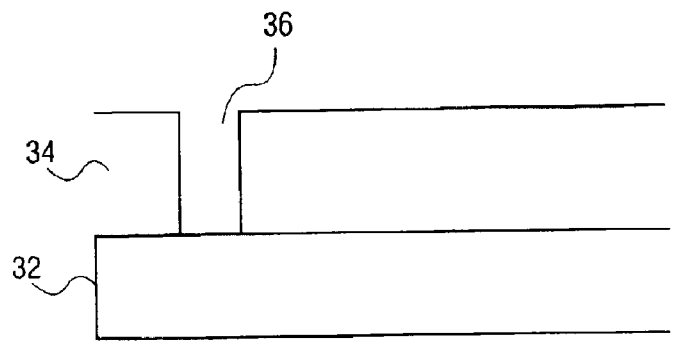
FIG. 2 illustrates forming an opening in a dielectric layer to expose a portion of an electrically conductive layer below the dielectric layer.

FIGS. 2–5 show an embodiment in which the annealing process is conducted prior to filling the dielectric opening with electrically conductive material. Specifically, FIG. 2 shows electrically conductive layer 32 and dielectric layer 34 coupled to electrically conductive layer 32. In addition, dielectric layer 34 has opening 36 formed therein, which exposes a portion of electrically conductive layer 32. Opening 36 can be formed by any suitable patterning technique including etching.

Figure 3:
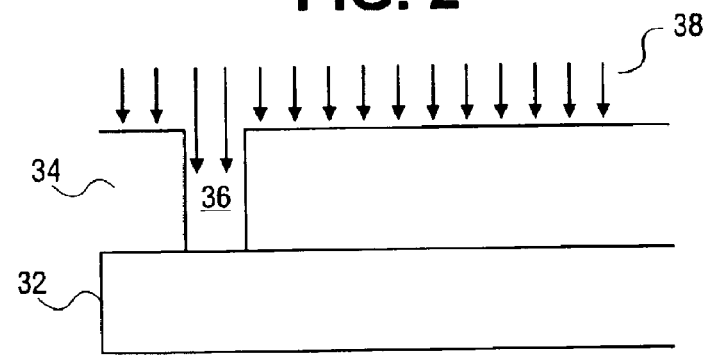
FIG. 3 shows implantation of a dopant into the electrically conductive layer through the opening formed in FIG. 2.
Figure 4:
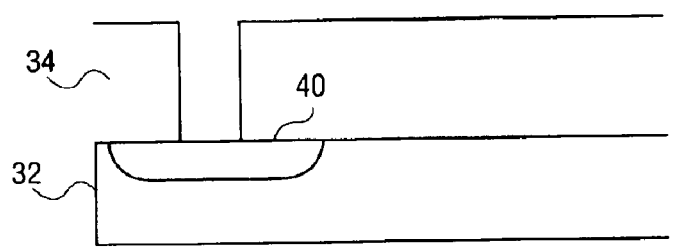
FIG. 4 shows a doped region which results from annealing the electrically conductive layer after the dopant from FIG. 3 has been implanted.

FIG. 3 shows the implantation of dopant 38 into electrically conductive layer 32 through opening 36. In the embodiment shown, dopant 38 is deposited across the entire length of dielectric layer 34. However, it is contemplated that other techniques could be used to selectively dope only through opening 36 without doping the remainder of dielectric layer 34. FIG. 4 shows doped region 40 which results from annealing electrically conductive layer 32 as described above in reference to FIG. 1.

Figure 5:
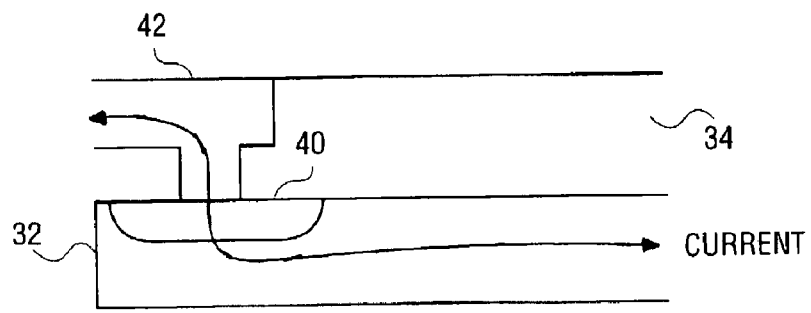
FIG. 5 shows filling the opening in the dielectric layer with electrically conductive material to complete the structure of FIG. 4.

FIG. 5 shows the structure of FIG. 4 after filling opening 36 with electrically conductive material 42. In the embodiment shown, electrically conductive material 42 is deposited according to a dual damascene process. However, the various embodiments disclosed herein contemplate other techniques for electrically coupling different layers (e.g., interconnects) and components.

The embodiment shown in FIG. 5 will generally have current flowing from the left side of electrically conductive material 42 to the right side of electrically conductive layer 32. Thus, electromigration (e.g., of copper atoms from left to right) would be most likely to occur beneath the location at which electrically conductive material 42 contacts electrically conductive layer 32, which is one impetus for doping in that location. Thus, doped region 40 is disposed such that at least a portion of doped region 40 is adjacent to the location where electrically conductive layer 32 contacts electrically conductive material 42. However, as shown in FIG. 5, the current may flow in either direction.

In addition, doped region 40 occupies less than the entire length of electrically conductive layer 32. In various embodiments, doped region 40 occupies much less than the entire length of electrically conductive layer 32. In fact, in various embodiments, doped region 40 is restricted to an area proximally adjacent to the location where electrically conductive material 42 contacts electrically conductive layer 32. The area will generally be defined by the amount of dopant introduced into conductive layer 32 and annealing conditions that may cause the dopant to migrate within conductive layer 32.

The restriction of length of doped region 40 to a location which is adjacent to the location in which electrically conductive material 42 contacts electrically conductive layer 32 tends to minimize the resistivity added by dopant 38. However, doped region 40 still provides for reduced electromigration of the material which comprises electrically conductive layer 32 (e.g., copper, aluminum, other conductive material, or a combination thereof). The reduction of electromigration, in turn, increases the reliability of the semiconductor device which uses this method and structure.

Figure 6:
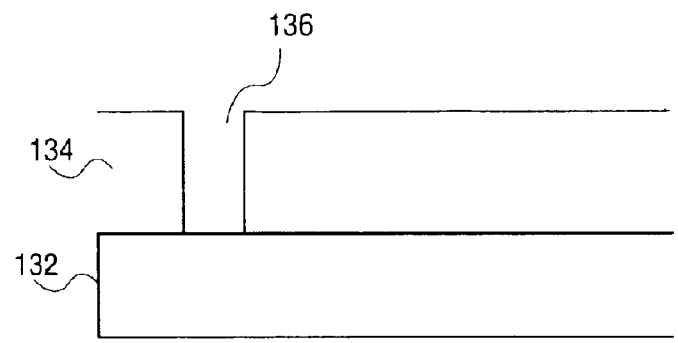
FIG. 6 shows a second embodiment in which an opening is formed in a dielectric layer to expose a portion of an electrically conductive layer.
Figure 7:
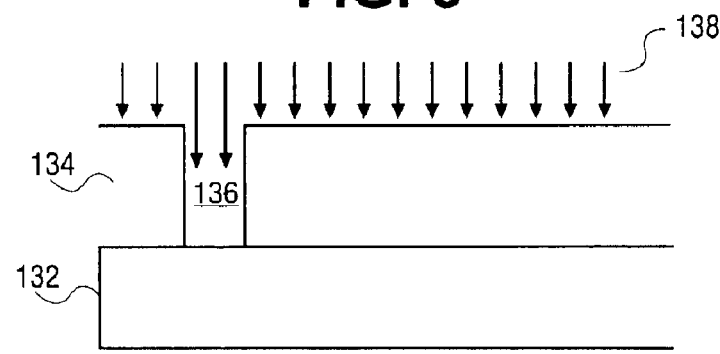
FIG. 7 shows implanting a dopant into the electrically conductive layer through the opening formed in FIG. 6.

Focusing now on FIGS. 6–9, an alternative embodiment is shown in which FIG. 6 depicts electrically conductive layer 132 with dielectric layer 134 coupled to electrically conductive layer 132. Dielectric layer 134 has opening 136 which exposes a portion of electrically conductive layer 132. FIG. 7 shows dopant 138 being implanted through opening 136 into the exposed portion of electrically conductive layer 132.

Figure 8:
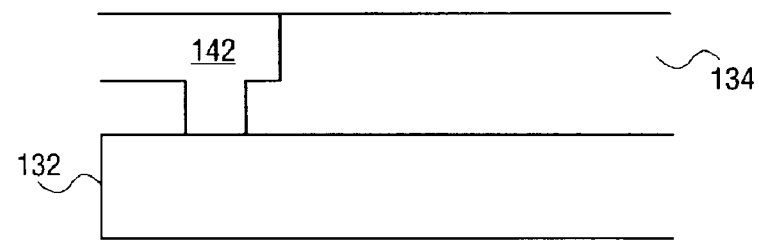
FIG. 8 shows filling the opening in the dielectric layer with electrically conductive material.

FIG. 8 shows that opening 136 is filled with electrically conductive material 142. In FIG. 8, electrically conductive material 142 is deposited in dielectric layer 134 according to a dual damascene process. However, other techniques and structures are contemplated.

Figure 9:
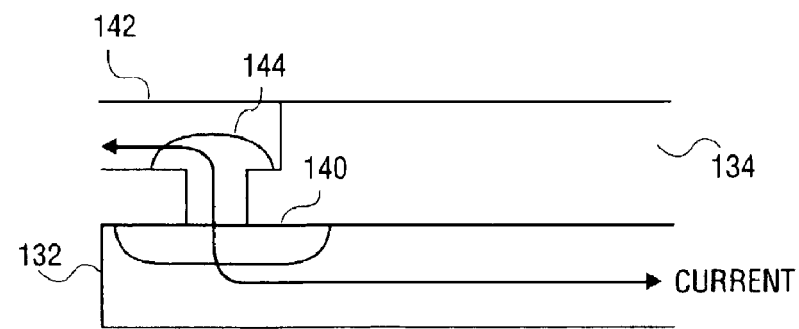
FIG. 9 shows annealing the electrically conductive layer to form a doped region in the electrically conductive layer and a doped region in the electrically conductive material deposited in FIG. 8.

FIG. 9 shows first doped region 140 in electrically conductive layer 132 and second doped region 144 in electrically conductive material 142. First doped region 140 and second doped region 144 are formed by annealing electrically conductive layer 132 after dopant 138 has been implanted into electrically conductive layer 132. Dopant 138 is able to diffuse to form first doped region 140 and second doped region 144. One advantage of this embodiment is that current can flow in either direction through the structure of FIG. 9 without causing electromigration of the material which comprises electrically conductive layer 132 and electrically conductive material 142.

It is contemplated that a barrier layer could be disposed between the electrically conductive layer and electrically conductive material. FIG. 9 shows optional barrier layer 141 between electronically conducive layer 132 and electronically conducive material 142. Such a barrier layer would prevent electromigration between electrically conductive layer 132 and electrically conductive material 142. However, in various embodiments, the barrier layer would not prevent the diffusion of dopant 138 into both electrically conducive layer 132 and electrically conductive material 142. An example of this can be seen in FIG. 9.

Also absent from the figures is the removal of excess dopant from the top of the dielectric layer in embodiments in which the dopant is implanted across the length of the dielectric layer. Such a removal could be achieved by a chemical mechanical polish or other suitable procedure.

It is to be understood that even though numerous characteristics and advantages of the various embodiments have been set forth in the foregoing description, together with details of structure and function, this disclosure is illustrative only. Changes may be made in detail, especially matters of structure and management of parts, without departing from the scope of the various embodiments as expressed by the broad general meaning of the terms of the appended claims.

I claim:

1. An apparatus comprising:
   an electrically conductive layer on a circuit substrate defining a first interconnect line;
   a dielectric layer mechanically coupled to the electrically conductive layer, the dielectric layer having an opening formed therein which exposes a portion of the electrically conductive layer; and
   electrically conductive material disposed within the opening in the dielectric layer associated with a second different interconnect line,
   wherein the electrically conductive material comprises a region doped with a material such that electromigration beyond the region is inhibited; and
   wherein at least a portion of the region extends into the electrically conductive layer.

2. The apparatus of claim 1, wherein the region is restricted to an area proximally adjacent to the location where the electrically conductive material contacts the electrically conductive layer.

3. The apparatus of claim 1, wherein the region comprises:
   at least one of tin, aluminum, silicon, and magnesium.

4. The apparatus of claim 1, wherein the electrically conductive layer comprises:
   at least one of aluminum and copper.

5. An integrated circuit comprising:
   a substrate;
   a first electrically conductive layer coupled to the substrate;
   a dielectric layer mechanically coupled to the electrically conductive layer, the dielectric layer having an opening formed therein which exposes a portion of the electrically conductive layer; and
   an electrically conductive material disposed within the opening in the dielectric layer associated with a second different interconnect layer,
   wherein the electrically conductive material comprises a region doped with a material selected to inhibit electromigration; and
   wherein at least a portion of the region extends into the electrically conductive layer.

6. The integrated circuit of claim 5, wherein the region is restricted to an area proximally adjacent to the location where the electrically conductive material contacts the electrically conductive layer.

7. The integrated circuit of claim 5, wherein the doped region comprises:
   at least one of tin, aluminum, silicon, and magnesium.

8. The integrated circuit of claim 5, wherein the electrically conductive layer comprises:
   at least one of aluminum and copper.

* * * * *